United States Patent
Shi

(10) Patent No.: US 8,084,283 B2
(45) Date of Patent: Dec. 27, 2011

(54) TOP CONTACT LED THERMAL MANAGEMENT

(75) Inventor: Wei Shi, San Jose, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 12/699,709

(22) Filed: Feb. 3, 2010

(65) Prior Publication Data
US 2010/0133581 A1 Jun. 3, 2010

Related U.S. Application Data

(62) Division of application No. 12/183,772, filed on Jul. 31, 2008.

(51) Int. Cl.
*H01L 33/48* (2010.01)
*H01L 31/12* (2010.01)
*H01L 27/15* (2010.01)

(52) U.S. Cl. ....... 438/26; 257/79; 257/99; 257/E33.075; 257/E33.066

(58) Field of Classification Search .............. 257/79, 257/99, E33.066, E33.075; 438/26
See application file for complete search history.

(56) References Cited

U.S. PATENT DOCUMENTS

| | | | |
|---|---|---|---|
| 5,479,105 A | 12/1995 | Kim et al. | |
| 5,643,830 A * | 7/1997 | Rostoker et al. | 438/106 |
| 7,157,745 B2 | 1/2007 | Blonder et al. | |
| 7,470,938 B2 | 12/2008 | Lee et al. | |
| 2004/0026708 A1* | 2/2004 | Chen | 257/99 |
| 2005/0006659 A1 | 1/2005 | Ng et al. | |
| 2005/0221521 A1* | 10/2005 | Lee et al. | 438/29 |
| 2006/0226437 A1 | 10/2006 | Fujita et al. | |
| 2006/0255342 A1* | 11/2006 | Kim et al. | 257/79 |
| 2007/0007540 A1* | 1/2007 | Hashimoto et al. | 257/94 |
| 2007/0090383 A1 | 4/2007 | Ota et al. | |
| 2007/0228386 A1* | 10/2007 | Shie et al. | 257/79 |
| 2007/0267642 A1 | 11/2007 | Erchak et al. | |
| 2008/0054280 A1 | 3/2008 | Reginelli et al. | |

OTHER PUBLICATIONS

PCT search report of Nov. 2, 2009 for PCT/US09/56401.

* cited by examiner

*Primary Examiner* — Thao Le
*Assistant Examiner* — Tanika Warrior
(74) *Attorney, Agent, or Firm* — Haynes and Boone, LLP

(57) ABSTRACT

An LED having enhanced heat dissipation is disclosed. For example, an LED die can have extended bond pads that are configured to enhance heat flow from an active region of the LED to a lead frame. A heat transmissive substrate can further enhance heat flow away from the LED die. By enhancing heat dissipation, more current can be used to drive the LED. The use of more current facilitates the production of brighter LEDs.

6 Claims, 6 Drawing Sheets

US 8,084,283 B2

TOP CONTACT LED THERMAL MANAGEMENT

RELATED APPLICATION

This patent application is a divisional application of a patent application Ser. No. 12/183,772, filed Jul. 31, 2008 and entitled TOP CONTACT LED THERMAL MANAGEMENT, the entire content of which is hereby incorporated explicitly by reference.

TECHNICAL FIELD

The present invention relates generally to light emitting diodes (LEDs). The present invention relates more particularly to methods and systems for providing thermal management for LEDs.

BACKGROUND

Light emitting diodes (LEDs) are well known. LEDs are semiconductor devices that emit light when the p-n junction thereof is forward biased. LEDs are commonly used as indicator lights on electronic devices. For example, the red power indicator on consumer electronic devices is often an LED.

The use of LEDs in higher power applications is increasing. For example, LEDs are being used in applications such as flashlights, displays, and area lighting. However, the brightness of an LED is limited, as least in part, by the ability of the LED to dissipate heat. Brighter LEDs require increased current. Increased current inherently results in increased heating of the LED.

As an LED gets hotter, its efficiency decreases. Thus, in order to take advantage of the increased current, the heat resulting therefrom must be managed, e.g., removed from the LED. Excessive heat also reduces the life of an LED.

In view of the foregoing, it is desirable to provide a method and system for managing heat in LEDs and the like.

BRIEF SUMMARY

Methods and systems for managing heat from a light emitting diode (LED) are disclosed herein. These methods and systems can provide enhanced heat dissipation for LEDs and the like. For example, in accordance with an example of an embodiment an LED die can comprise extended bond pads that are configured to enhance heat flow from an active region of the LED to a lead frame. Heat can then flow from the lead frame to a heat transmissive substrate, from which the heat can be radiated into the air and/or conducted to another structure.

According to an example of an embodiment, an LED die can comprise a substrate, a layer of n-type material formed upon the substrate and a layer of p-type material formed upon the substrate. The p-type material can cooperate with the n-type material to define an active region. At least one bond pad can be formed upon the n-type material and/or the p-type material. The bond pad can be configured to facilitate attachment of the LED to a lead frame. Further, the bond pad can be configured to facilitate heat flow from an active region of the LED to a lead frame. For example, the bond pad can be extended or enlarged with respect to contemporary bond pads.

According to an example of an embodiment, an LED assembly can comprise at least one die, a lead frame, and at least one bond pad formed upon the die. The bond pad can be configured to facilitate attachment of the die to the lead frame. Further, the bond pad can be configured to facilitate heat flow from the die to a lead frame.

According to an example of an embodiment, a method for forming an LED die can comprise forming extended bond pads upon at least one of a p-type material and an n-type material. The bond pads can be configured to enhance heat flow from an active region of the LED to a lead frame.

According to an example of an embodiment, a method for fabricating an LED die can comprise providing a substrate, forming a layer of n-type material upon the substrate, and forming a layer of p-type material upon the substrate. The p-type material can cooperate with the n-type material to define an active region. At least one bond pad can be formed upon the n-type material and/or the p-type material. The bond pad can be configured to facilitate attachment of the LED to a lead frame. Further, the bond pad can be configured to facilitate heat flow from an active region of the LED to a lead frame.

According to an example of an embodiment, a method for fabricating an LED assembly can comprise providing at least one die and attaching the die/dice to a lead frame via a bond pad formed upon the die/dice. The bond pad can be configured to facilitate heat flow from the die to a lead frame.

By enhancing heat flow from the LEDs, brighter LEDs can be provided. These brighter LEDs can be used in such applications as flashlights, displays, and area lighting.

This invention will be more fully understood in conjunction with the following detailed description taken together with the following drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
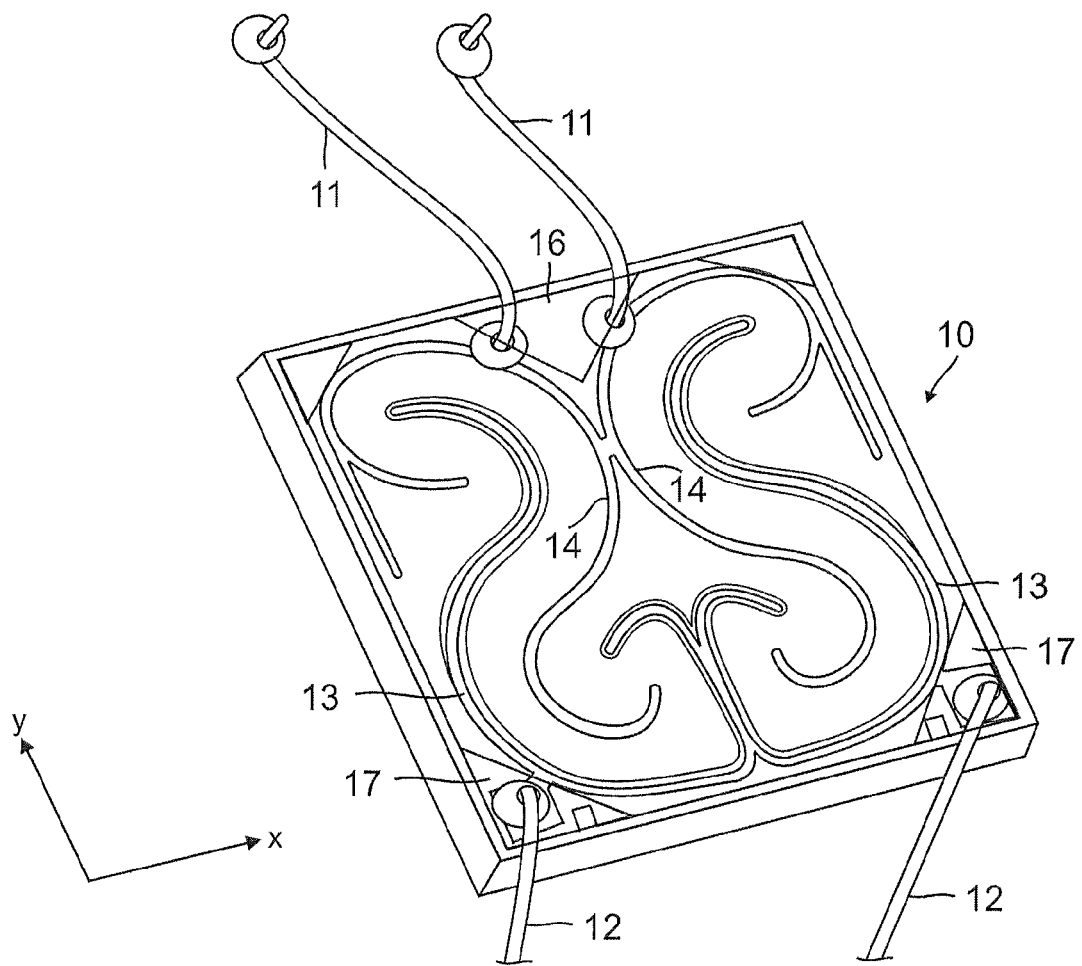
FIG. 1 is a semi-schematic perspective view of a contemporary light emitting diode (LED) die, showing the non-enlarged or non-extended bond pads thereof.

Methods and systems for enhancing heat dissipation from LEDs are disclosed. For example, an LED die can have extended bond pads that are configured to enhance heat flow from an active region of the LED to a lead frame. A heat transmissive substrate can further enhance heat flow away from the LED die. By enhancing heat dissipation, more current can be used to drive the LED. The use of more current facilitates the production of brighter LEDs.

According to an example of an embodiment, an LED die can comprise extended bond pads that are configured to enhance heat flow from an active region of the LED. For example, heat flow from the LED to a lead frame can be facilitated.

According to an example of an embodiment, an LED die can comprise a substrate, a layer of n-type material formed upon the substrate, and a layer of p-type material formed upon the substrate. The p-type material can cooperate with the n-type material to define an active region of the LED. At least one bond pad can be formed upon the n-type material and/or the p-type material. The bond pad can be configured to facilitate attachment of the LED to a lead frame. Further, the bond pad can be configured to facilitate heat flow from an active region of the LED to a lead frame.

The bond pads can be formed upon both the n-type material and the p-type material. The bond pad(s) can be formed to have approximately equal height, so as to facilitate attachment thereof to the lead frame. The bond pads comprise a metal, such as gold.

According to an example of an embodiment, an LED assembly can comprise at least one die, a lead frame, and at least one bond pad formed upon the die. The bond pad(s) can be configured to facilitate attachment of the die to the lead frame. Further, the bond pads can be configured to facilitate heat flow from the die to a lead frame.

A plurality of dice can be attached to the lead frame. One or more bond pads can be formed upon the n-type material of the die/dice and one or more bond pads can be formed upon a p-type material of the die/dice. A heat transmissive substrate can be attached to the die/dice and configured to facilitate heat flow away from the die/dice. The heat transmissive substrate can comprise a metal or combination of metals. For example, the heat transmissive substrate can comprise copper or aluminum.

The heat transmissive substrate can be attached to the lead frame and the die/dice via solder. The die/dice can be disposed generally between the lead frame and the heat transmissive substrate.

According to an example of an embodiment, a method for forming an LED die can comprise forming a extended bond pad upon a p-type material and/or an n-type material. The bond pad(s) can be configured to enhance heat flow from an active region of the LED to a lead frame.

According to an example of an embodiment, a method for fabricating an LED die can comprise providing a substrate, forming a layer of n-type material upon the substrate, and forming a layer of p-type material upon the substrate. The p-type material can cooperate with the n-type material to define an active region. At least one bond pad can be formed upon the n-type material and/or the p-type material. Any desired number of bond pads can be formed upon the n-type material and/or the p-type material. The bond pad(s) can be configured to facilitate attachment of the LED to a lead frame. Further, the bond pad(s) can be configured to facilitate heat flow from an active region of the LED to a lead frame.

According to an example of an embodiment, a method for fabricating an LED assembly can comprise providing at least one die and attaching the die/dice to a lead frame via a bond pad formed upon the die/dice. The bond pad can be configured to facilitate heat flow from the die to a lead frame.

Referring now to FIG. 1, a contemporary LED die 10 comprises n-type material and p-type material formed upon a substrate so as to define an active region. Current is provided to the active region via wires 11 attached to one of the types of material, e.g. the p-type material, and via wires 12 attached to the other type of material, e.g., the n-type material. Current can be distributed to the active region more effectively using current spreader or current spreading layers 13 and 14 according to well-known principles.

The wires 11 and 12 attach to bond pads 16 and 17. The bond pads 16 and 17 of a contemporary die do not facilitate substantial heat flow from the active region. Indeed, the bond pads 16 and 17 may, at least in some instances, inhibit heat flow from the active region of a contemporary die.

Figure 2:
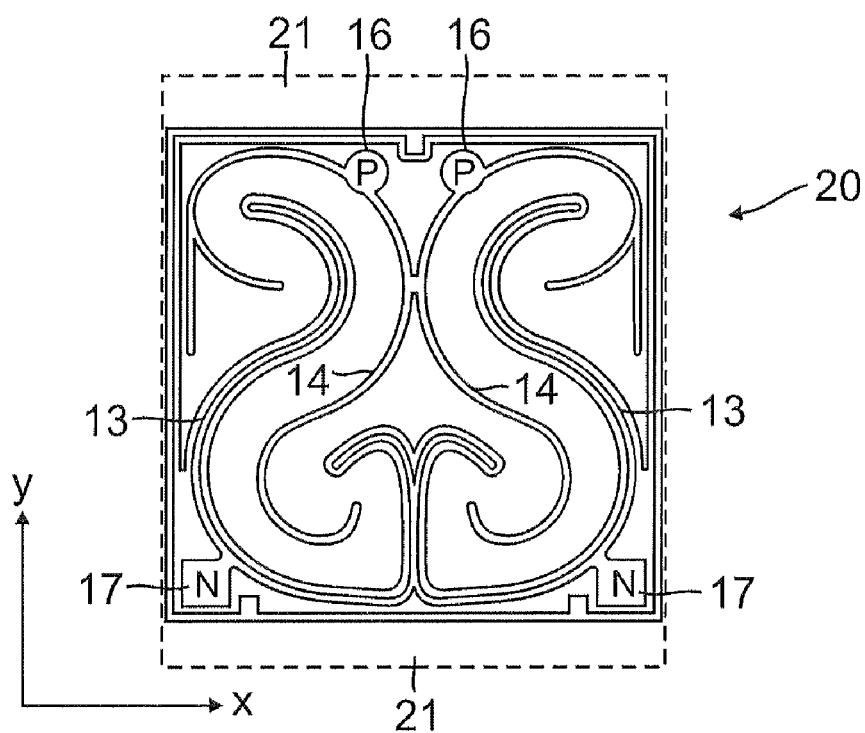
FIG. 2 is a semi-schematic top view of an LED die, showing areas into which the bond pads (the P-pad and the N-pad) can be enlarged according to an example of an embodiment.

Referring now to FIG. 2, according to an example of an embodiment the pads 16 and 17 can be enlarged so as to extend beyond the area of the die shown in FIG. 1. For example, the pads 16 and 17 can be enlarged in the Y direction (both up and down as shown in FIG. 2) to define extended pads 21. The pads 16 and 17 can alternatively be extended in the X direction. The pads 16 and 17 can be extended in both the X and Y directions. The pads 16 and 17 can be extended in any desired direction or directions.

In this manner, the pads 16 and 17 can be made more heat transmissive. More particularly, the pads 16 and 17 can be configured to facilitate heat flow from the active region of die 20. For example, the pads 16 and 17 can be configured to facilitate heat flow from the active region of die 20 to a lead frame as discussed herein.

Figure 3:
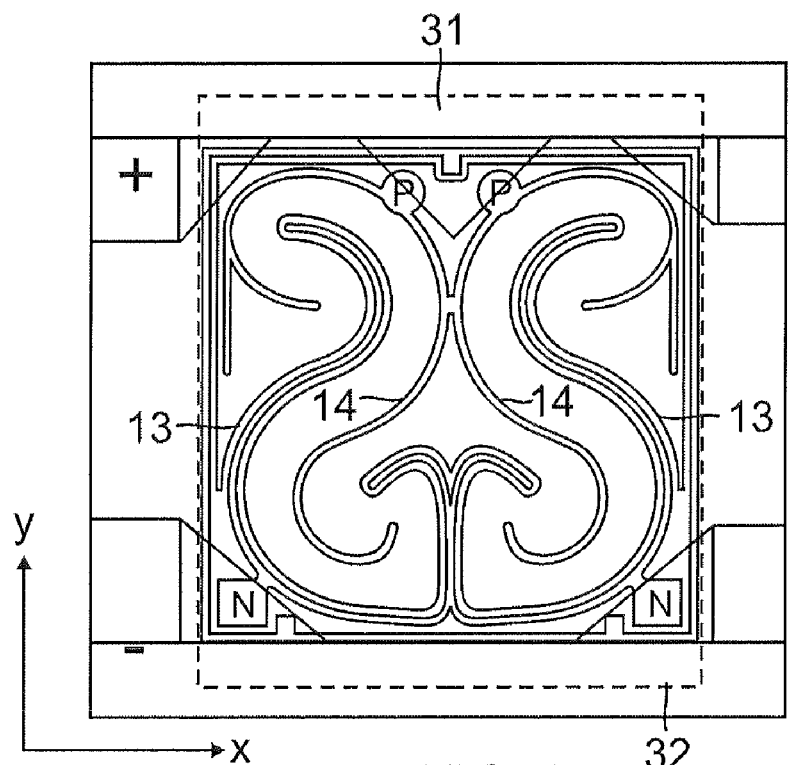
FIG. 3 is a semi-schematic top view of an LED die, showing enlargement of the areas of the bond pads according to an example of an embodiment.

Referring now to FIG. 3, the pads 16 and 17 have been enlarged in both the Y and X directions. Pads 16 and 17 have been enlarged to define extended pads 31 and 32. Extended pads 31 and 32 facilitate electrical contact between the die and a lead frame.

Extended pads 31 and 32 also facilitate heat flow from the die, e.g., the active region of the die, to the lead frame. This extension of the pads 16 and 17 facilitates such heat flow by enhancing physical (and thus thermal) contact between the die and the lead frame.

Figure 4:
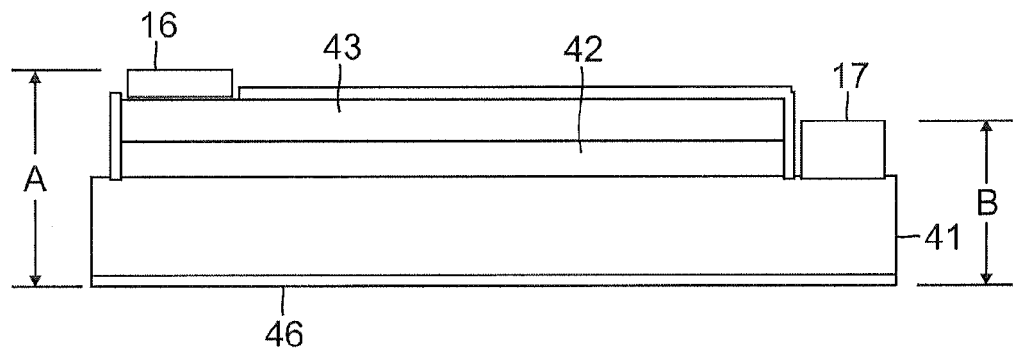
FIG. 4 is a semi-schematic side view of a contemporary LED die, showing the size of the bond pads, such as for comparison to FIG. 5.

Referring now to FIG. 4, a contemporary die comprises a substrate 41 having a layer of n-type material 42 and a layer of p-type material 43 formed thereon. For example, the substrate 41 can comprise alumina ($Al_2O_3$). Those skilled in the art will appreciate that other materials are likewise suitable.

For example, the p-type material 43 can comprise p-doped gallium arsenide (GaS) and the n-type material 42 can comprise n-doped gallium nitride (GaN). Those skilled in the art will appreciate that other materials are likewise suitable.

A p-pad 16 is formed on the p-type material 43 so as to facilitate current flow to the p-type material 43. An n-pad 17 is formed on the substrate 41 so as to facilitate current flow to the n-type material 42. Wires (such as wires 11 and 12 of FIG. 1) are wire bonded to the p-pad 16 and the n-pad 17.

A reflector 46 can be formed to the bottom of the substrate 41. For example, the reflector can comprise gold. Those skilled in the art will appreciate that other materials are likewise suitable.

The upper surface of the layer of p-type material 43 and the side surfaces of the layer of p-type material 43 and the layer of n-type material 42 have a layer of silicon dioxide ($SiO_2$) formed thereon.

The top of the p-pad 16 and the top of the n-pad 17 are at different heights in this contemporary LED die. The top of the p-pad 16 has a height of Dimension A and the top of the n-pad 17 has a height of Dimension B. Dimension A and Dimension B are substantially different from one another. This difference in height is not important in this LED die because it is to be wire bonded, according to contemporary practice.

Figure 5:
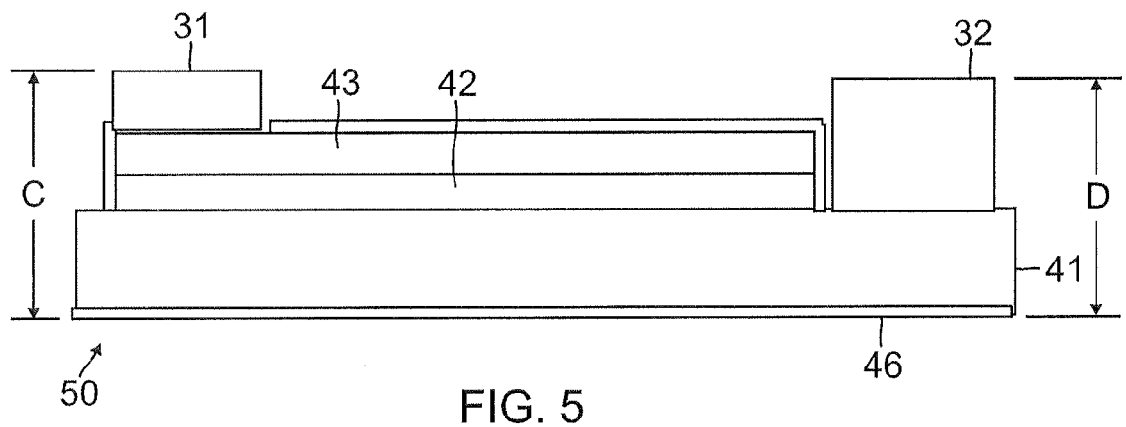
FIG. 5 is a semi-schematic side view of an LED die showing an increase of the area and the height of the bond pads according to an example of an embodiment.

Referring now to FIG. 5, an LED die 50 having extended pads 31 and 32 is shown in cross-section. The top of extended p-pad 31 and the top of extended n-pad 32 are at approximately the same height. The top of extended p-pad 31 has a height of Dimension C and the top of extended n-pad 32 has a height of Dimension D. Dimension C and Dimension D are substantially the same. Wire bonds are not used in this example of an embodiment.

Figure 6:
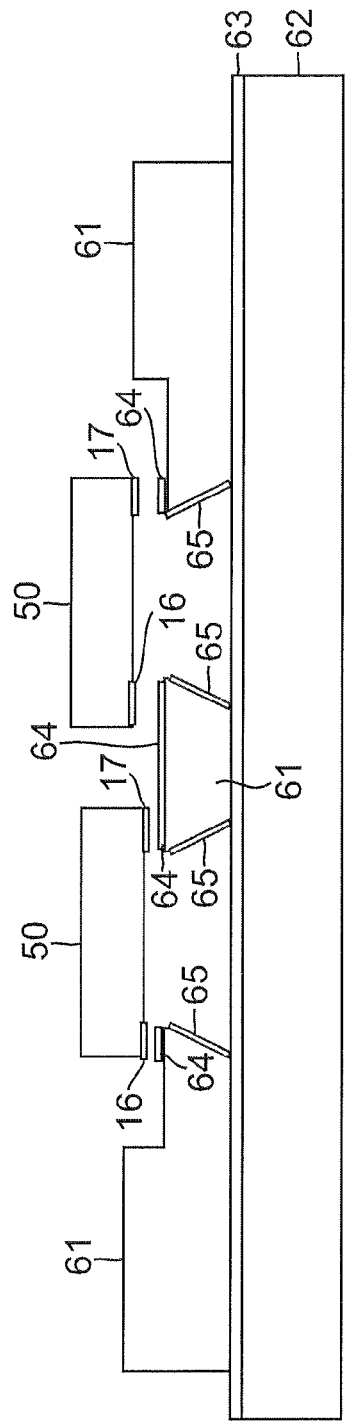
FIG. 6 is a semi-schematic side view of two LED dice that are positioned for attachment to a lead frame, wherein the lead frame is attached to a transparent carrier, according to an example of an embodiment.

By making the top of extended p-pad 31 and the top of extended n-pad 32 have approximately the same height, the die can more readily be attached to a lead frame (as shown in FIG. 6). That is, the lead frame can be generally flat and can contact the extended p-pad 31 and the top of extended n-pad 32.

Referring now to FIG. 6, two dice 50, each having extended pads 31 and 32 (as in FIG. 5) are positioned for attachment to a lead frame 61. The two dice 50 each can have extended bond pads 16 and 17. The bond pads 16 and 17 can have substantially the same height. The lead frame can facilitate the flow of heat away from the dice 50.

The lead frame 61 can comprise a thermally conductive material, such as copper. The lead frame 61 can have a layer of gold applied thereto. The layer of gold can be applied to the lead frame 61 on the surfaces thereof that contact extended pads 31 and 32 and/or the layer of gold can be applied to the lead frame 61 on surfaces thereof that do not contact extended pads 31. As those skilled in the art will appreciate, such gold layers can both enhance electrical connection of the lead frame 61 to the dice 50 and can enhance the thermal conductivity of the lead frame 61.

The extended pads 31 and 32 of the dice 50 can be attached to the lead frame 61 via fluxless soldering. For example, gold/tin (AuSn) solder can be used to attach the dice 50 can to the lead frame 61.

The lead frame 61 can temporarily or permanently rest upon and be supported by a transparent carrier 62, for example, via an adhesive 63 such as a low-tack adhesive tape. Transparent carrier 62 facilitates handling and processing of the lead frame 61 and attached dice 50. An alignment camera can be used to align the dice 50 to the lead frame 61 to facilitate attachment of the dice 50 to the lead frame 61.

Solder layers 64 can be formed upon the lead frame 61 so as to facilitate attachment of the dice 50 thereto. Solder layers 64 can comprise gold (Au) solder or gold/tin (AuSn) solder, for example.

Reflectors 65 can be formed upon the side walls of the lead frame 61. Reflectors 65 can comprise silver (Ag) or aluminum (Al), for example. Reflectors 65 direct light from dice 50 upward through phosphor 91 (FIG. 9).

Figure 7:
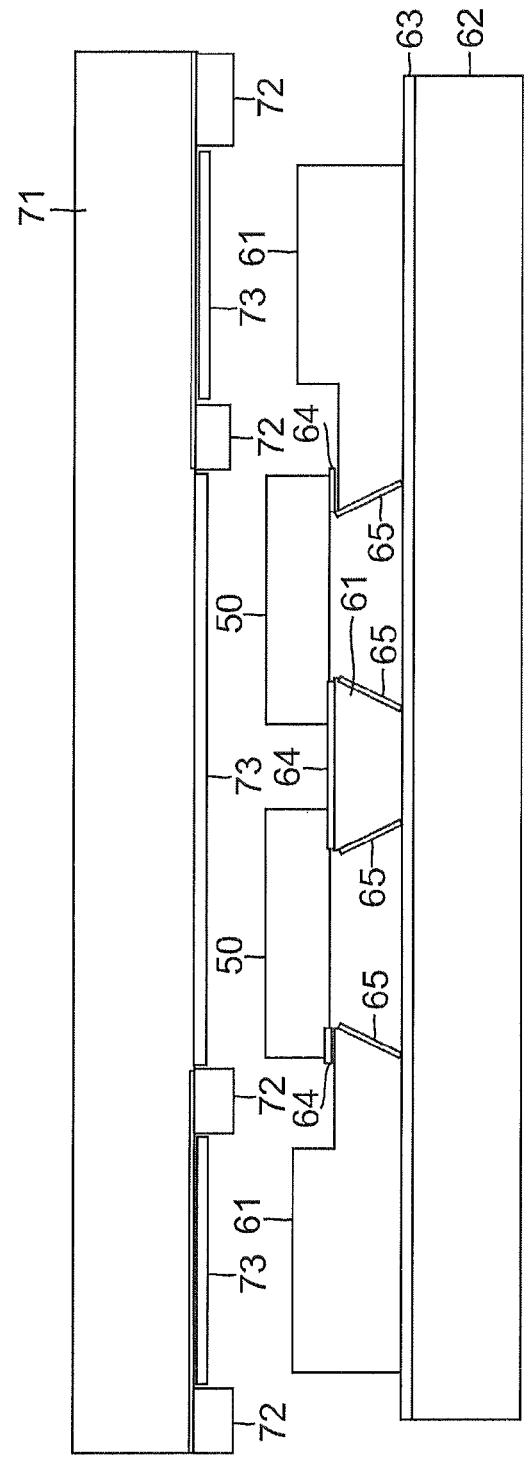
FIG. 7 is a semi-schematic side view of two LED dice that are attached to a lead frame, wherein the lead frame is attached to a transparent carrier as in FIG. 6, and further showing a substrate positioned for attachment to the dice and lead frame, according to an example of an embodiment.

Referring now to FIG. 7, heat transmissive substrate 71 is positioned for attachment to the lead frame 61 and/or the dice 50. For example, a solder mask 72 can be applied to the heat transmissive substrate 71 to facilitate patterning of the heat transmissive substrate 71 with solder 73. The heat transmissive substrate 71 can be patterned with tin/silver (SnAg) solder, for example. Reflow soldering can thus be used to attach the thermally transmissive substrate 71 to lead frame 61 and/or the dice 50.

Figure 8:
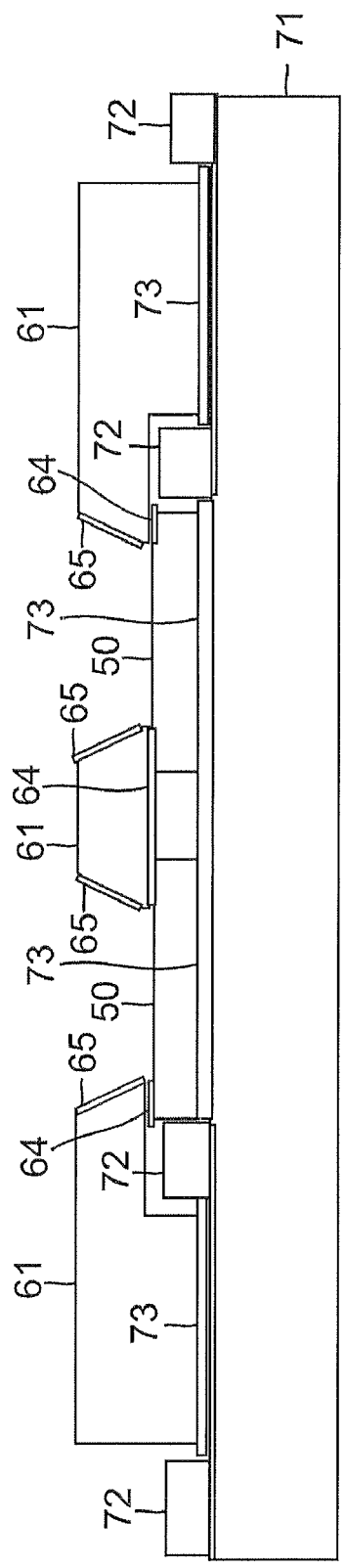
FIG. 8 is a semi-schematic side view of two LED dice that are attached to a lead frame as in FIG. 6, a substrate positioned attached to the dice and lead frame and showing the transparent carrier removed from the lead frame, according to an example of an embodiment.

Referring now to FIG. 8, the transparent carrier 62 can be detached from the lead frame 61. The transparent carrier 62 is generally not needed to support the lead frame 61 and the dice 50 after the thermally transmissive substrate 71 has been attached to the lead frame 61 and/or the dice 50.

Figure 9:
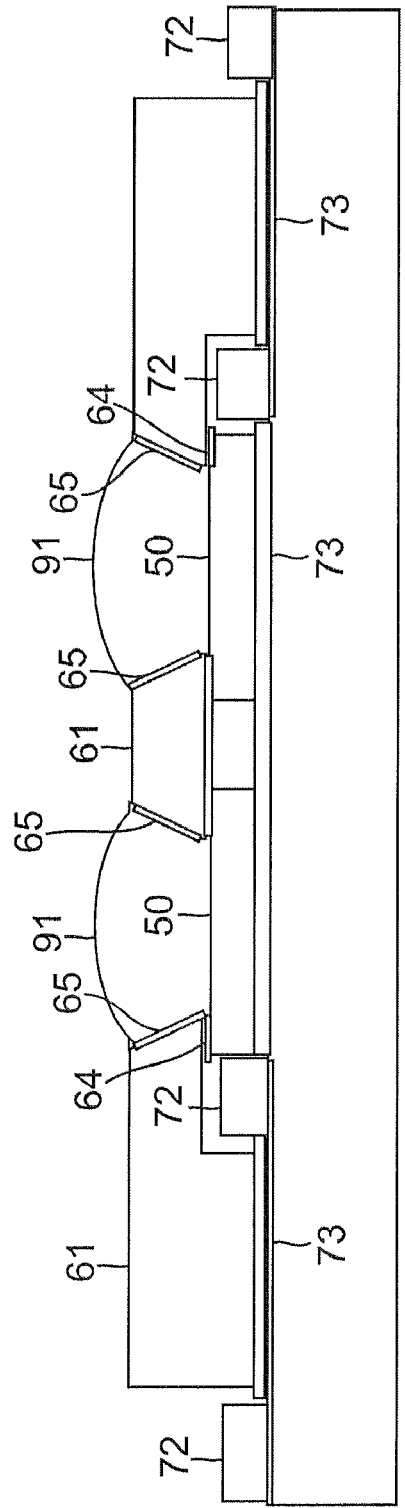
FIG. 9 is a semi-schematic side view of two LED dice that are attached to a lead frame as in FIG. 6, showing phosphors formed atop the dice, according to an example of an embodiment.

Referring now to FIG. 9, one or more phosphor 91 can be deposited upon the dice 50 so as to change the color of light emitted thereby. Alternatively, the phosphor(s) 91 can be omitted. One or more lenses can also be formed to the dice 50.

According to an example of an embodiment, heat from an LED or the like can readily flow from the device into a lead frame via extended bond pads of the device. Heat can then flow from the lead frame to a heat transmissive substrate. Heat from the heat transmissive substrate can be radiated into the air and/or conducted to another structure. For example, heat from the heat transmissive substrate can be conducted into a fixture, mount, bracket, package, or other structure within or to which the heat transmissive substrate is mounted.

Figure 10:
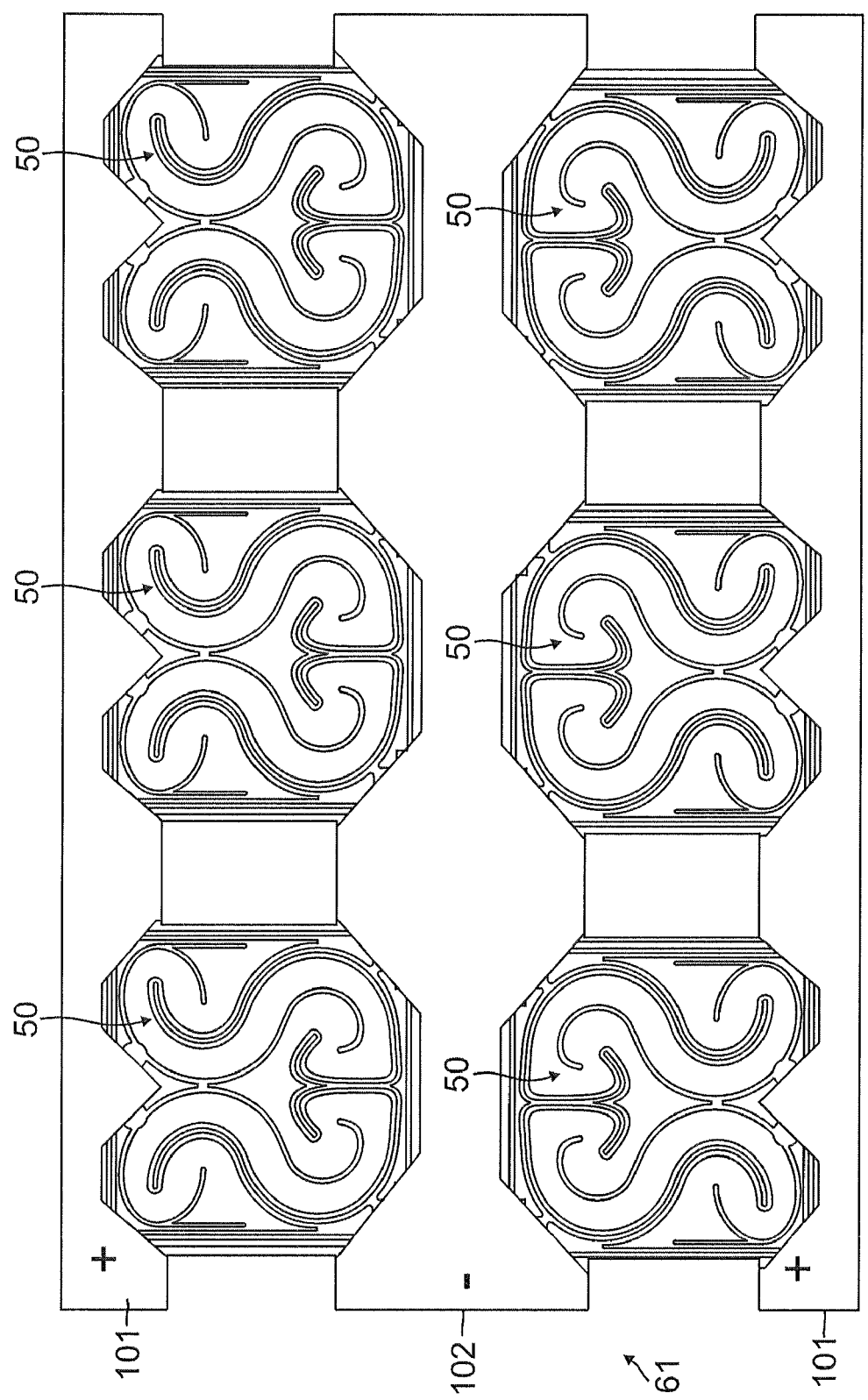
FIG. 10 is a semi-schematic top view of a lead frame layout, according to an example of an embodiment.

Referring now to FIG. 10, according to an example of an embodiment a lead frame can comprise one or more positive buses 101 and one or more negative buses 102. The positive bus(es) 101 can alternate with the negative bus(es) 102. In this manner, current can be provided to the LED die 50. Further, heat can be carried away from the dice 50 via the positive bus(es) 101 and the negative bus(es) 102 of the lead frame 61.

As used herein, the term "active region" can be defined to include a region in a light-emitting diode where injected electrons and holes recombine to generate photons in the LED when current is applied.

As used herein "formed upon" can be defined to include deposited, etched, attached, or otherwise prepared or fabricated upon when referring to the forming the various layers.

As used herein "on" and "upon" can be defined to include positioned directly or indirectly on or above.

As used herein, the term "package" can be defined to include an assembly of elements that houses one or more LED chips and provides an interface between the LED chip(s) and a power source to the LED chip(s). A package can also provide optical elements for the purpose of directing light generated by the LED chip. Examples of optical elements are lens and reflectors.

As used herein, the term "transparent" can be defined to include the characterization that no significant obstruction or absorption of electromagnetic radiation occurs at the particular wavelength or wavelengths of interest.

As used herein, the term "spreader layer" can be defined to include a layer that spreads current and is separate from the layers in the LED core.

By enhancing heat dissipation, more current can be used to drive LEDs. The use of more current facilitates the production of brighter LEDs. The production of brighter LEDs facilitates use in such applications as flashlights, displays, and area lighting.

Further, the use of a lead frame eliminates the need for wire bonds. As those skilled in the art will appreciate, the use of wire bonds increases the cost of packaging LEDs and decreases the yield of the packaging process.

Embodiments described above illustrate, but do not limit, the invention. It should also be understood that numerous modifications and variations are possible in accordance with the principles of the present invention. Accordingly, the scope of the invention is defined only by the following claims.

The invention claimed is:

1. A method for fabricating a light emitting diode (LED) die, the method comprising:
   providing a substrate;
   forming a layer of n-type material upon the substrate;
   forming a layer of p-type material upon the substrate, the p-type material cooperating with the n-type material to define an active region; and
   forming a first extended, heat transmissive bond pad directly on the p-type material;
   forming a second extended, heat transmissive bond pad directly on the substrate;
   attaching the LED die to a lead frame via the first and second extended, heat transmissive bond pads, wherein the at least one extended, heat transmissive bond pad facilitates heat flow from an active region of the LED to the lead frame; and
   attaching a heat transmissive substrate to the lead frame and the LED die.

2. The method as recited in claim 1, wherein forming the first bond pad and the second bond pad comprises forming the first bond pad to a first height and the second bond pad to a second height such that a distance measured from a back surface of the substrate to a top surface of the first bond pad is approximately equal to a distance measured from the back surface of the substrate to a top surface of the second bond pad.

3. A method for fabricating a light emitting diode (LED) assembly, the method comprising:
   providing at least one LED die;
   forming at least one heat transmissive bond pad directly on an active area of the at least one die, the at least one heat transmissive bond pad being formed to extend beyond an area of the at least one die in at least one direction;
   attaching a lead frame to the at least one die via the at least one heat transmissive bond pad, wherein the at least one heat transmissive bond pad facilitates heat flow from the at least one die to the lead frame;
   attaching a heat transmissive substrate to the lead frame and the at least one die; and
   wherein the at least one bond pad comprises a first bond pad formed directly on a substrate of the at least one die and a second bond pad is formed directly on a p-type material of the at least one die.

4. The method as recited in claim 3, wherein the first bond pad has a first height and the second bond pad has a second height such that a distance measured from a back surface of the substrate to a top surface of the first bond pad is approximately equal to a distance measured from the back surface of the substrate to a top surface of the second bond pad.

5. The method as recited in claim 3, wherein the heat transmissive substrate is configured to facilitate heat flow away from the at least one die.

6. The LED assembly as recited in claim 3, further comprising soldering the heat transmissive substrate to the lead frame and the at least one via solder.

\* \* \* \* \*